United States Patent
Wang et al.

(10) Patent No.: US 9,299,643 B2
(45) Date of Patent: Mar. 29, 2016

(54) RUTHENIUM INTERCONNECT WITH HIGH ASPECT RATIO AND METHOD OF FABRICATION THEREOF

(75) Inventors: Zheng Wang, Mountain View, CA (US); Connie Wang, Mountain View, CA (US); Erik Wilson, Santa Clara, CA (US); Wen Yu, Pleasanton, CA (US); Robert Chiu, San Jose, CA (US)

(73) Assignee: Cypress Semiconductor Corporation, San Jose, CA (US)

(*) Notice: Subject to any disclaimer, the term of this patent is extended or adjusted under 35 U.S.C. 154(b) by 351 days.

(21) Appl. No.: 12/286,149

(22) Filed: Sep. 29, 2008

(65) Prior Publication Data

US 2010/0078815 A1    Apr. 1, 2010

(51) Int. Cl.
| | |
|---|---|
| *H01L 29/40* | (2006.01) |
| *H01L 23/485* | (2006.01) |
| *H01L 21/768* | (2006.01) |
| *H01L 23/532* | (2006.01) |
| *H01L 27/105* | (2006.01) |
| *H01L 27/115* | (2006.01) |

(52) U.S. Cl.
CPC ........ *H01L 23/485* (2013.01); *H01L 21/76877* (2013.01); *H01L 23/53252* (2013.01); *H01L 27/105* (2013.01); *H01L 27/1052* (2013.01); *H01L 27/115* (2013.01); *H01L 27/11517* (2013.01); *H01L 2924/0002* (2013.01)

(58) Field of Classification Search
CPC ............. H01L 21/76877; H01L 28/55; H01L 21/28518
USPC ................... 257/300, 303, E21.011; 438/396
See application file for complete search history.

(56) References Cited

U.S. PATENT DOCUMENTS

| | | | | |
|---|---|---|---|---|
| 5,731,047 | A * | 3/1998 | Noddin .......................... | 427/555 |
| 5,744,832 | A * | 4/1998 | Wolters et al. ................. | 257/295 |
| 5,847,327 | A * | 12/1998 | Fischer et al. ................. | 174/258 |
| 5,888,888 | A * | 3/1999 | Talwar et al. .................. | 438/533 |
| 6,479,100 | B2 | 11/2002 | Jin et al. ......................... | 427/255 |
| 6,509,601 | B1 * | 1/2003 | Lee et al. ....................... | 257/310 |
| 6,544,835 | B2 | 4/2003 | Yamamoto et al. ............ | 438/240 |
| 7,285,308 | B2 | 10/2007 | Hendrix et al. ................ | 427/248 |
| 2006/0065928 | A1 * | 3/2006 | Nagai .............................. | 257/344 |
| 2006/0223300 | A1 * | 10/2006 | Simka et al. .................... | 438/618 |
| 2009/0065940 | A1 * | 3/2009 | Kim et al. ....................... | 257/754 |

* cited by examiner

*Primary Examiner* — John C Ingham
(74) *Attorney, Agent, or Firm* — Lowenstein Sandler LLP (57) ABSTRACT

An electrically conductive interconnect is provided through an opening in a dielectric layer, electrically connecting two conductive layers. In one embodiment, the interconnect is formed by ruthenium entirely filling the opening in the dielectric layer. In another embodiment, an adhesion layer of titanium is provided in the opening prior to providing the ruthenium. In using this approach, an aspect ratio (i.e., the ratio of the length of the interconnect to the width thereof) of 20:1 or greater is achievable.

6 Claims, 7 Drawing Sheets

RUTHENIUM INTERCONNECT WITH HIGH ASPECT RATIO AND METHOD OF FABRICATION THEREOF

BACKGROUND OF THE INVENTION

1. Field of the Invention

This invention relates generally to electronic devices, and more particularly, to interconnect structures for providing electrical conductivity between conductive layers.

2. Discussion of the Related Art

Figure 1:
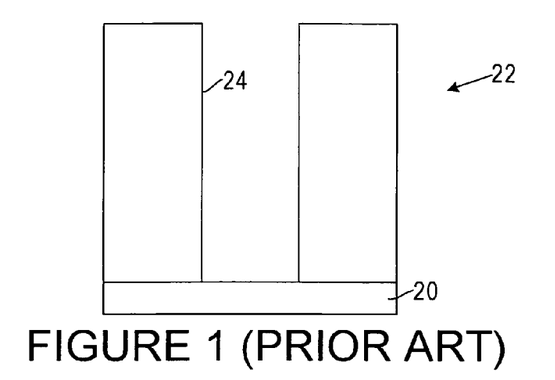
FIGS. 1-6 illustrate fabrication of an electrically conductive interconnect in accordance with the prior art.

FIGS. 1-6 illustrate the formation of an interconnect for providing electrically conductive connection between conductive layers in accordance with the prior art. Referring to FIG. 1, initially, a conductive, for example metal layer 20 is provided, and a dielectric layer 22, for example silicon dioxide or silicon nitride, is provided on the conductive layer 20. Using well-known photolithographic techniques, a photoresist layer (not shown) is provided on the dielectric layer 22, and is patterned to provide an opening in the photoresist to expose a portion of the dielectric layer 22. Using the remaining photoresist as a mask, an etching step is undertaken, etching away part of the dielectric layer 22 down to the metal layer 20 to provide an opening or passage 24 therethrough to expose a portion of the metal layer 20.

Figure 2:
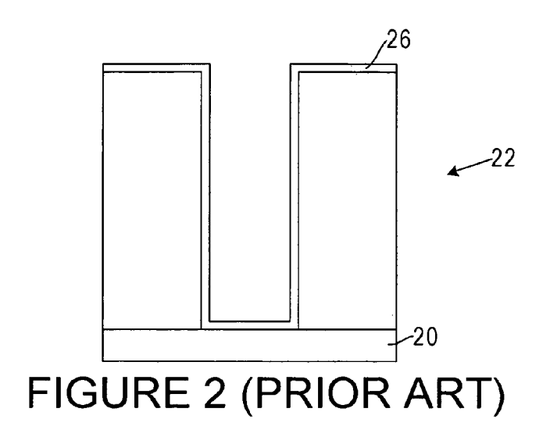

After removal of the photoresist, a Ti/TiN adhesion layer 26 is deposited on the resulting structure, i.e., on the exposed top surface of the dielectric layer 22 and in the opening 24 and on the exposed portion of the metal layer 20 as shown in FIG. 2.

Figure 3:
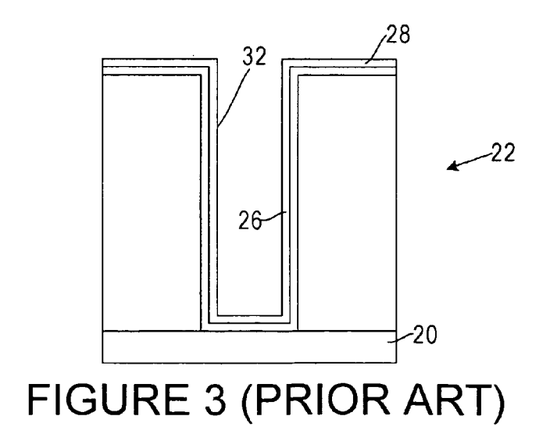
Figure 4:
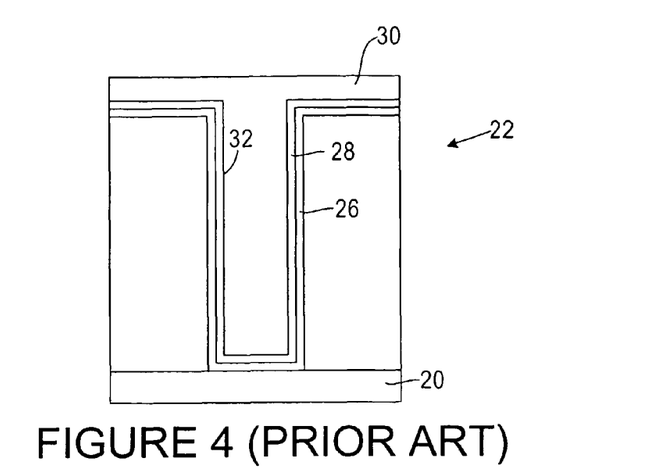
Figure 5:
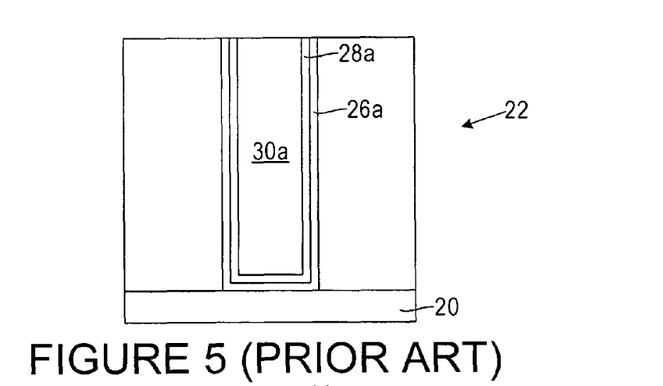
Figure 6:
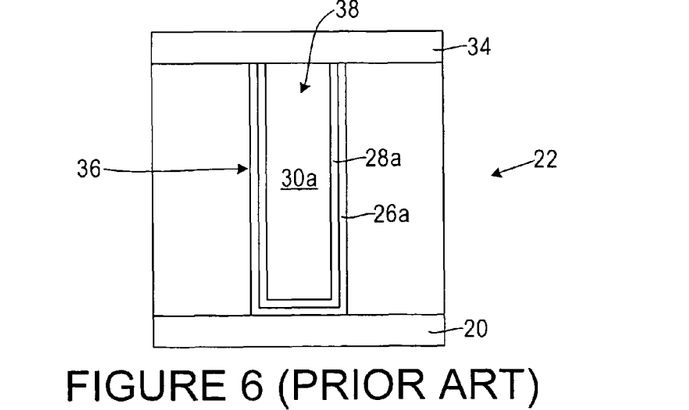

Next, a tungsten nucleation layer 28 is deposited on the entire Ti/TiN adhesion layer 26, the tungsten nucleation layer 28 having a thickness on the order of 50A (FIG. 3). Tungsten 30 is then deposited on the resulting structure, in contact with the tungsten nucleation layer 28 and filling the remaining opening 32 (FIGS. 3 and 4). A chemical-mechanical polish step is undertaken to remove portions of the tungsten 30, tungsten nucleation layer 28, and Ti/TiN adhesion layer 26 down to the top surface of the dielectric layer 22, resulting in the structure shown in FIG. 5, including remaining adhesion layer 26a, tungsten nucleation layer 28a, and tungsten body 30a in the opening. Then, a metal layer 34 is deposited over the resulting structure, in contact with the exposed portion of the material 36 made up of remaining adhesion layer 26a, tungsten nucleation layer 28a, and tungsten body 30a in the opening 24 (FIG. 6). The material 36 in the opening 24 forms an electrically conductive interconnect or plug 38 which provides electrically conductive connection between the conductive metal layer 20 and conductive metal layer 34.

It will be readily understood that it is desirable that the conductive interconnect 38 have very low resistance. The inclusion of a tungsten nucleation layer 28 as described above significantly increases the resistance of the interconnect 38 to electric current traveling between one metal layer and the other. For example, the resistivity of the tungsten nucleation layer is approximately 100 $\mu\Omega$-cm, and the inclusion thereof greatly increases the overall resistance of the interconnect 38 as compared to pure tungsten.

In addition, there is a continuing trend in electronic devices to decrease device dimensions where possible. In furtherance thereof, the ratio of the length of the conductive interconnect to the cross-sectional width thereof, i.e., the aspect ratio thereof, at approximately 15:1 the in present technology, is expected to increase, i.e., for a given length of conductive interconnect, the cross-sectional width thereof is expected to decrease. This in itself will provide an increase in the resistance of the interconnect.

There is therefore an urgent need to overcome these problems by providing a conductive interconnect or plug with substantially reduced resistance as compared to the prior art. The conductive interconnect should be formed by a simple and cost-effective process and provide high contact integrity.

SUMMARY OF THE INVENTION

Broadly stated, the present electronic structure comprises first and second conductive bodies, a dielectric layer between the first and second conductive bodies, the dielectric layer defining an opening therethrough, and a ruthenium body entirely filling the opening in the dielectric layer.

Further broadly stated, the present electronic structure comprises first and second conductive bodies, a dielectric layer between the first and second conductive bodies, the dielectric layer defining an opening therethrough, an adhesion layer within the opening in the dielectric layer and defining a remaining opening, and a ruthenium body entirely filling the remaining opening.

Further broadly stated, the present electronic structure comprises first and second conductive bodies, a dielectric layer between the first and second conductive bodies, the dielectric layer defining an opening therethrough, and an electrically conductive interconnect in the opening in the dielectric layer and providing electrically conductive connection between the first and second conductive bodies, the electrically conductive interconnect comprising an adhesion layer and a ruthenium body.

Further broadly stated, the present electronic structure comprises first and second conductive bodies, a dielectric layer between the first and second conductive bodies, the dielectric layer defining an opening therethrough, and an elongated electrically conductive interconnect in the opening providing electrically conductive connection between the first and second conductive bodies, the electrically conductive interconnect comprising ruthenium, wherein the ratio of the length of the electrically conductive interconnect to the minimum cross-sectional width of the electrically conductive interconnect is 20:1 or greater.

Further broadly stated, the present electronic structure comprises providing a first conductive body, providing a dielectric layer over the first conductive body, providing an opening through the dielectric layer, providing a ruthenium body entirely filling the opening in the dielectric layer, and providing a second conductive body over the dielectric layer.

Further broadly stated is a method of fabricating an electronic structure comprising providing a first conductive body, providing a dielectric layer over the first conductive body, providing an opening through the dielectric layer, providing an adhesion layer in the opening through the dielectric layer to define a remaining opening, providing a ruthenium body entirely filling the remaining opening, and providing a second conductive body over the dielectric layer.

The present invention is better understood upon consideration of the detailed description below, in conjunction with the accompanying drawings. As will become readily apparent to those skilled in the art from the following description, there are shown and described embodiments of this invention simply by way of the illustration of the best mode to carry out the invention. As will be realized, the invention is capable of other embodiments and its several details are capable of modifications and various obvious aspects, all without departing from the scope of the invention. Accordingly, the drawings and detailed description will be regarded as illustrative in nature and not as restrictive.

BRIEF DESCRIPTION OF THE DRAWINGS

The novel features believed characteristic of the invention are set forth in the appended claims. The invention itself, however, as well as said preferred mode of use, and further objects and advantages thereof, will best be understood by reference to the following detailed description of illustrative embodiments when read in conjunction with the accompanying drawings, wherein:

DETAILED DESCRIPTION

Reference is now made in detail to specific embodiments of the present invention which illustrate the best mode presently contemplated by the inventors for practicing the invention.

Figure 7:
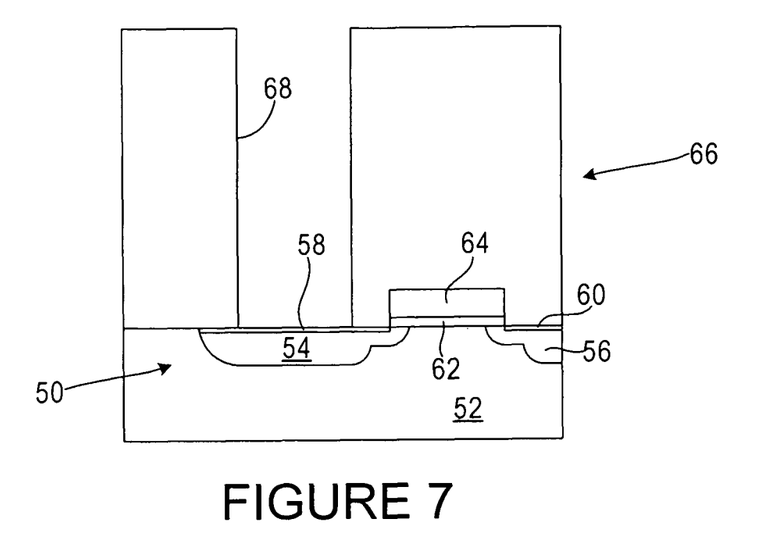
FIGS. 7-10 illustrate fabrication of an electrically conductive interconnect in accordance with a first embodiment of the invention.
Figure 8:
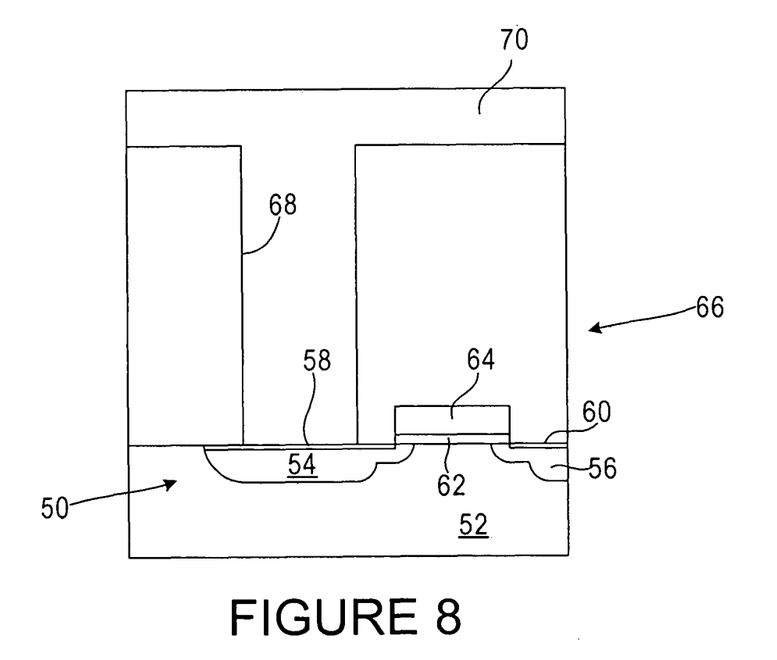
Figure 9:
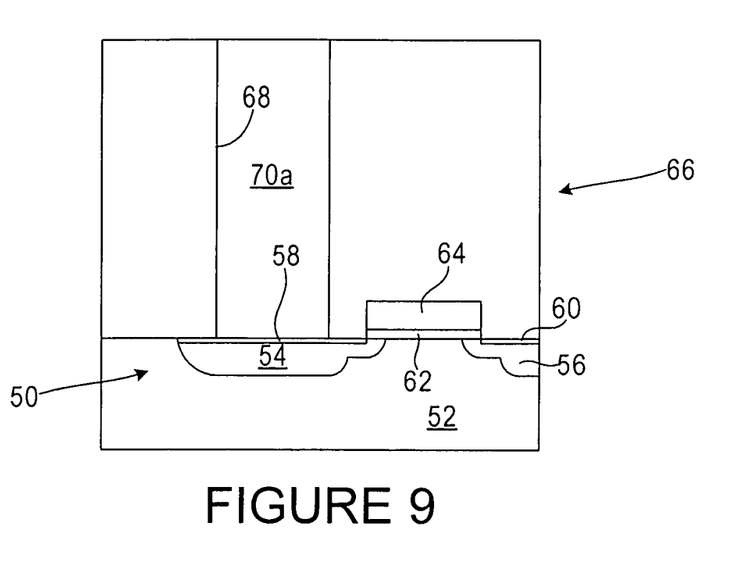
Figure 10:
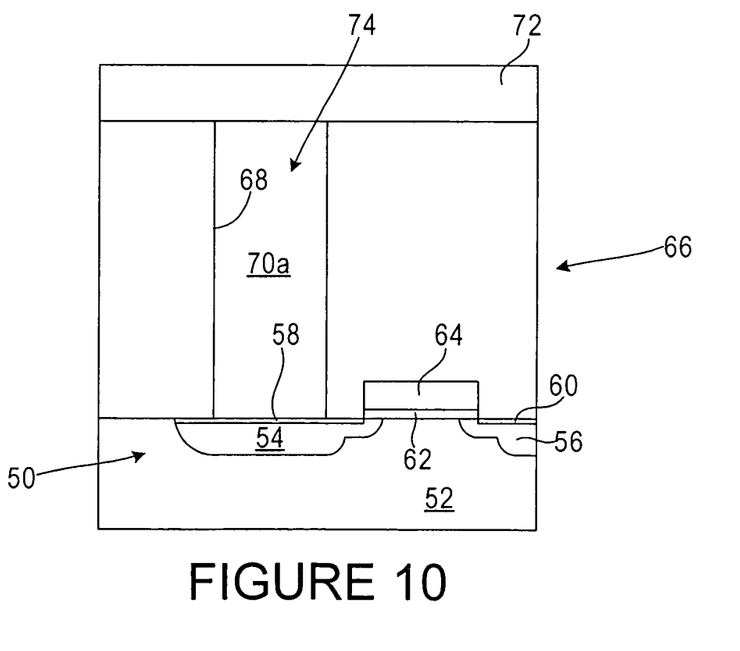

FIGS. 7-10 illustrate steps in fabricating a first embodiment of the present invention. FIG. 7 illustrates a transistor 50 including a substrate 52, source/drain regions 54, 56 having respective conductive silicide layers 58, 60 formed on and in contact therewith, gate oxide 62 and gate 64. The transistor 50 may, for example, be part of a NOR memory array. A dielectric layer 66, for example, silicon dioxide or silicon nitride, is deposited over that structure. Using well-known photolithographic techniques, a photoresist layer (not shown) is provided on the dielectric layer 66, and is patterned to provide an opening in the photoresist to expose a portion of the dielectric layer 66. Using the remaining photoresist as a mask, an etching step is undertaken, etching away part of the dielectric layer 66 down to the conductive layer 58 to provide an opening or passage 68 therethrough to expose a portion of the conductive layer 58. After removal of the photoresist, ruthenium 70 is deposited on the resulting structure, using chemical vapor deposition (CVD), physical vapor deposition (PVD), or atomic layer deposition (ALD) (FIG. 8). In this step, ruthenium 70 is deposited into the opening 68 and in contact with the dielectric layer 66, entirely filling the opening 68 and contacting the conductive layer 58. A chemical-mechanical polish step is undertaken to remove a portion of the ruthenium down to the top surface of the dielectric layer 66, resulting in the structure shown in FIG. 9, including remaining ruthenium body 70a entirely filling the opening 68 through the dielectric layer 66. (FIG. 9). Then, a conductive metal layer 72 (for example, copper or tantalum) is deposited over the resulting structure, in contact with the exposed portion of the ruthenium body 70a in the opening 68, the dielectric layer 66 being between the conductive layer 58 and conductive layer 72 (FIG. 10). The ruthenium body 70a filling the opening 68 forms an elongated electrically conductive interconnect or plug 74 which provides electrically conductive connection between the conductive layer 58 and conductive layer 72. The gate 64 of the transistor 50 is a word line of the memory array, while the conductive layer 72 is a bit line thereof.

The ruthenium has low bulk resistivity and has good adhesion to the dielectric layer 66 as well as to copper and tantalum. As will readily be seen, the inclusion of a high-resistivity tungsten nucleation layer is avoided. Resistance of the present interconnect 74 is substantially reduced relative to a comparable prior art plug.

Figure 11:
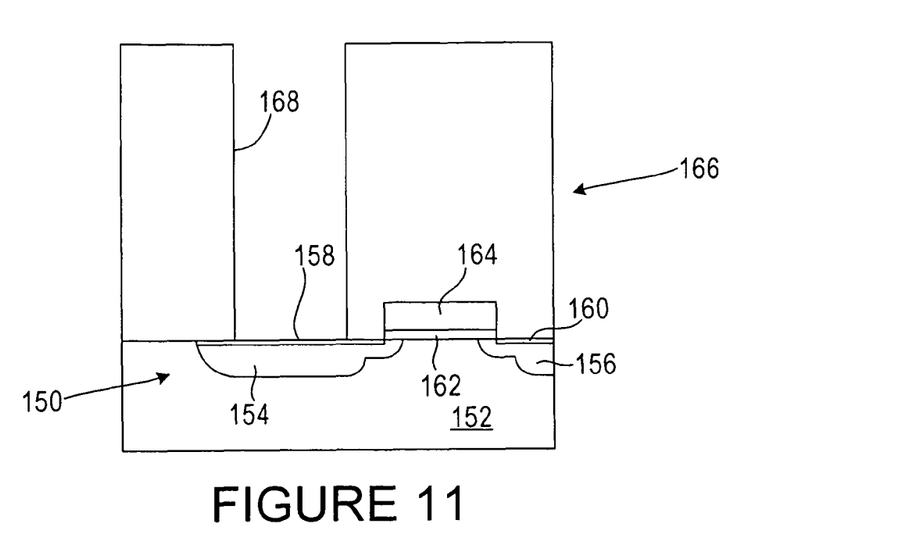
FIGS. 11-15 illustrate fabrication of an electrically conductive interconnect in accordance with a second embodiment of the invention.
Figure 12:
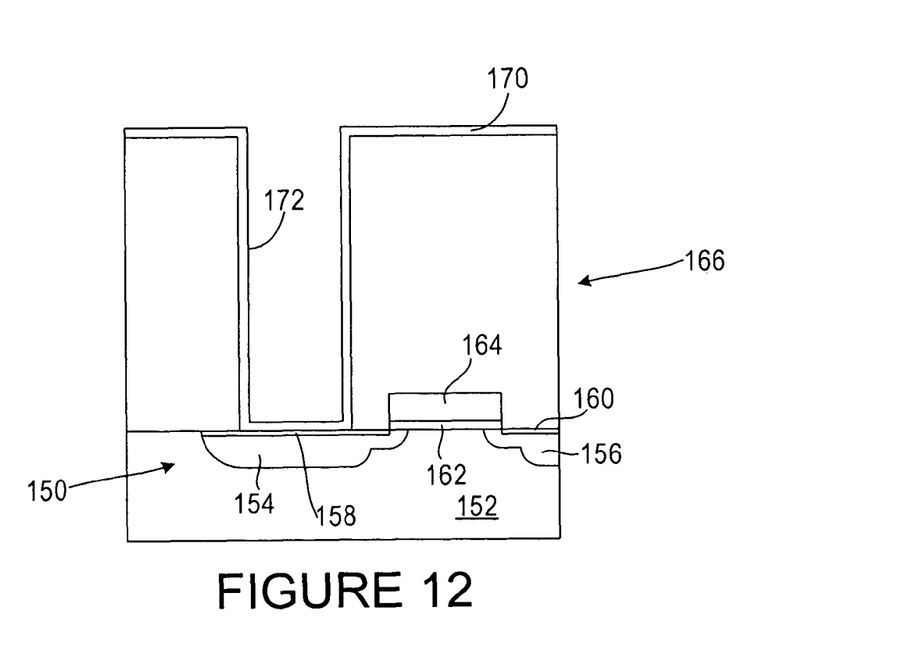
Figure 13:
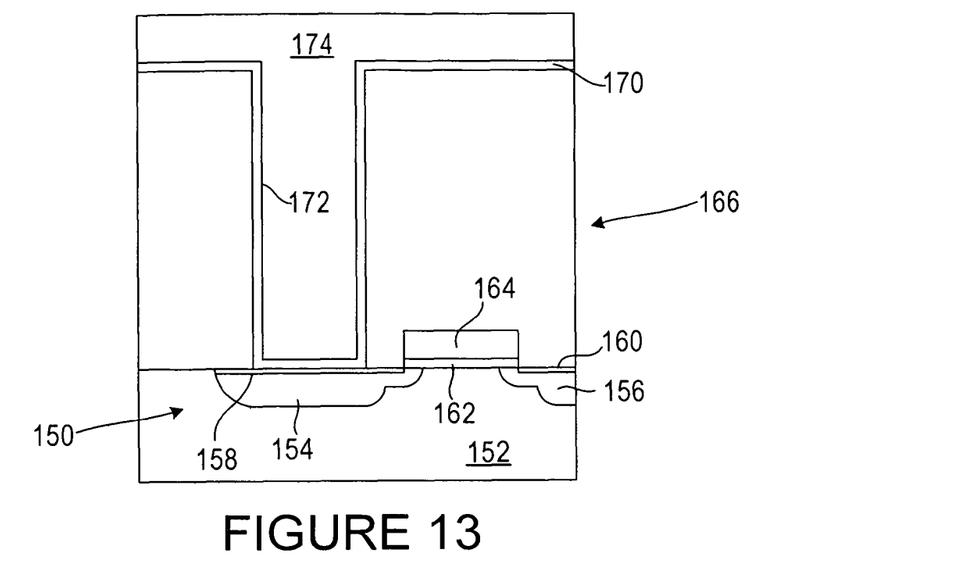
Figure 14:
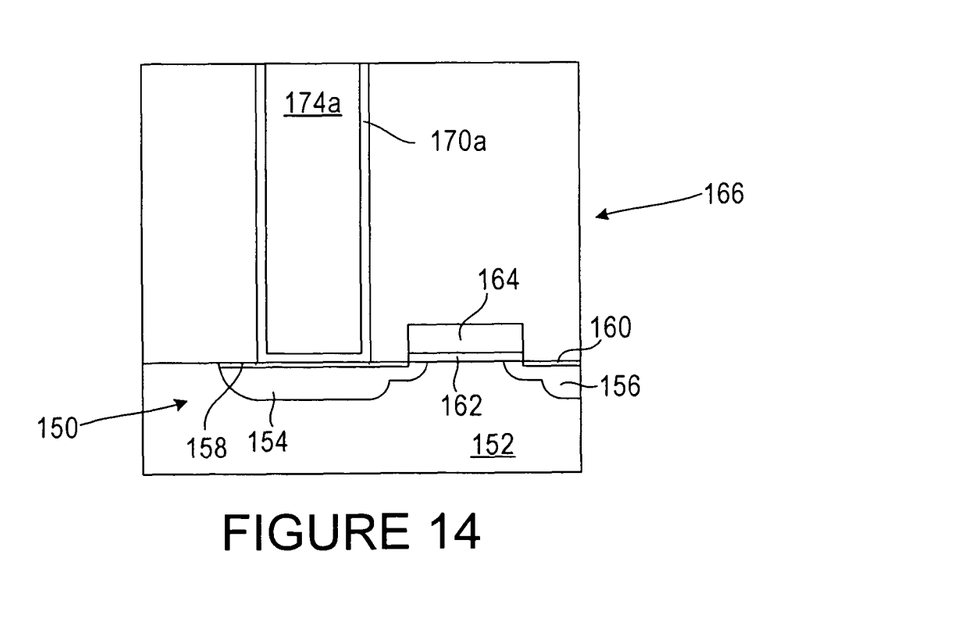

FIGS. 11-15 illustrate steps in fabricating a second embodiment of the present invention. Again, FIG. 11 illustrates a transistor 150 including a substrate 152, source/drain regions 154, 156 having respective conductive silicide layers 158, 160 formed on and in contact therewith, gate oxide 162 and gate 164. The transistor 150 may, for example, be part of a NOR memory array. A dielectric layer 166, for example, silicon dioxide or silicon nitride, is deposited over that structure. Using well-known photolithographic techniques, a photoresist layer (not shown) is provided on the dielectric layer 166, and is patterned to provide an opening in the photoresist to expose a portion of the dielectric layer 166. Using the remaining photoresist as a mask, an etching step is undertaken, etching away part of the dielectric layer 166 down to the conductive layer 158 to provide an opening or passage 168 therethrough to expose a portion of the conductive layer 158. After removal of the photoresist, a Ti adhesion layer 170 is deposited on the resulting structure, i.e., on the exposed top surface of the dielectric layer 166 and in the opening 168 and on and in contact with the exposed portion of the conductive layer 158 as shown in FIG. 12, and defining a remaining opening 172. Ruthenium 174 is then deposited on the resulting structure, using chemical vapor deposition (CVD), physical vapor deposition (PVD), or atomic layer deposition (ALD) (FIG. 13). In this step, ruthenium 174 is deposited into the remaining opening 172 and over the dielectric layer 166, contacting the adhesion layer 170 and entirely filling the remaining opening 172. A chemical-mechanical polish step is undertaken to remove portions of the ruthenium and titanium down to the top surface of the dielectric layer 166, resulting in the structure shown in FIG. 14, including remaining ruthenium body 174a and remaining adhesion layer 170a. Then, a conductive metal layer 176 (for example, copper or tantalum) is deposited over the resulting structure, in contact with the exposed portion of the ruthenium body 174a and the exposed portions of the adhesion layer 170a in the opening 168 (FIG. 15), the dielectric layer 166 being between the conductive layer 158 and conductive layer 176. The remaining ruthenium body 174a and remaining titanium adhesion layer 170a form an elongated electrically conductive interconnect or plug 178 which provides electrically conductive connection between the conductive layer 158 and conductive layer 176. The gate 164 of the transistor 150 is a word line of the memory array, while the conductive layer 176 is a bit line thereof.

Figures 15, 16:
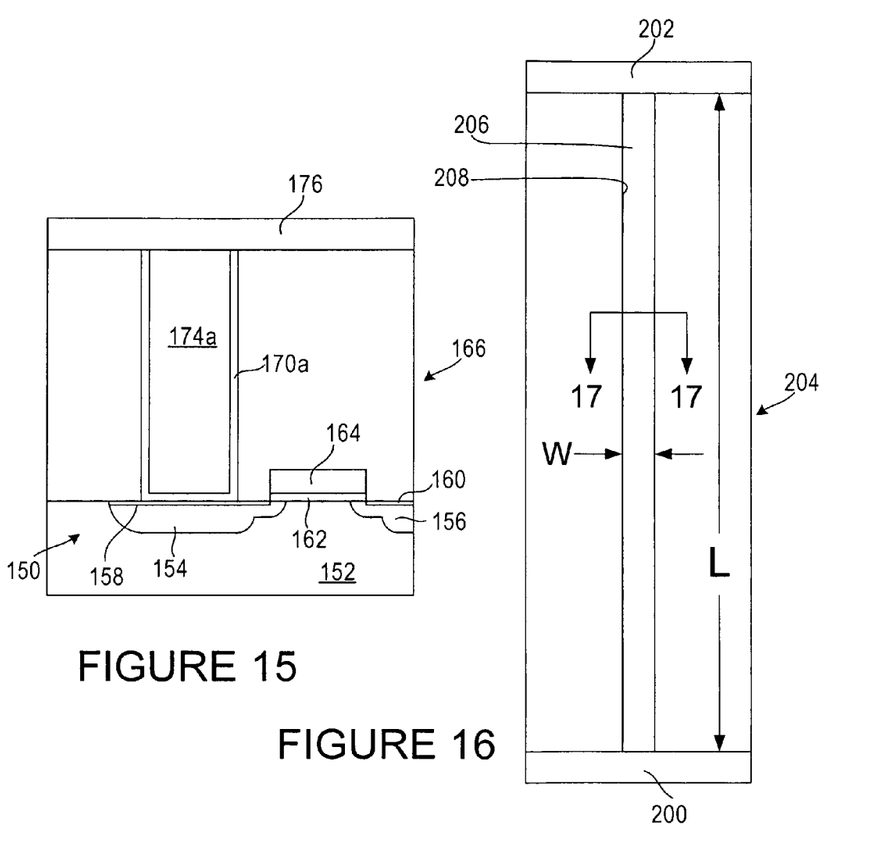
FIG. 16 illustrates an electrically conductive interconnect made in accordance with the present invention and showing dimensional proportions thereof.

Again, the ruthenium has low bulk resistivity and has good adhesion to the dielectric 166 as well as to copper and tantalum. Use of a high-resistivity tungsten nucleation layer is avoided, and resistance of the present plug is substantially reduced relative to a comparable prior art plug. The inclusion of the titanium adhesion layer 170 enhances adhesion of the ruthenium and also enhances gettering.

In both embodiments, the provided electrically conductive interconnect is of lower resistance than in the prior art, and formed by a simple and cost-effective process providing high contact integrity.

Figure 17:
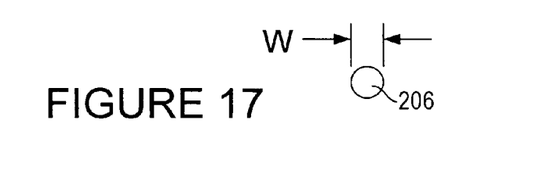
FIG. 17 is a sectional view taken along the line 17-17 of FIG. 16.

For practical purposes, FIGS. 7-10 and 11-15 do not illustrate the true proportions of the device. The true proportions of a device formed in accordance with either of the embodiments of the present invention is shown in FIGS. 16 and 17. For example, referring to FIGS. 16 and 17, first and second conductive layers 200, 202 are included, and a dielectric layer 204 is included between the conductive layers 200, 202, all as described above. The elongated electrically conductive ruthenium (and titanium if included) interconnect 206 in the opening 208 through the dielectric layer 204 provides electrically conductive connection between the conductive layers 200, 202. The aspect ratio of the interconnect 206, i.e., the ratio of the length L to the minimum cross-sectional width W, is 20:1 or greater, i.e., in this particular embodiment 21:1, while achieving low resistance of the interconnect 206. This is achievable through use of the approaches described above.

The foregoing description of the embodiments of the invention has been presented for purposes of illustration and description. It is not intended to be exhaustive or to limit the invention to the precise form disclosed. Other modifications or variations are possible in light of the above teachings.

The embodiments were chosen and described to provide the best illustration of the principles of the invention and its practical application to thereby enable one of ordinary skill of the art to utilize the invention in various embodiments and with various modifications as are suited to the particular use contemplated. All such modifications and variations are within the scope of the invention as determined by the appended claims when interpreted in accordance with the breadth to which they are fairly, legally and equitably entitled.

What is claimed is:

1. An electronic structure comprising:
   a first conductive body, wherein the first conductive body is a silicide layer formed on and in contact with a source/drain of a transistor, a gate oxide and a gate, wherein the gate is a word line of a memory array;
   a second conductive body, wherein the second conductive body is a bit line of the memory array;
   a dielectric layer between and in contact with the first and second conductive bodies, the dielectric layer defining an opening therethrough, an upper surface of the dielectric layer forming a plane, the second conductive body formed on the upper surface, wherein the dielectric layer comprises a silicon nitride layer;
   an adhesion layer within the opening in the dielectric layer; and
   an elongated electrically conductive interconnect in the opening providing electrically conductive connection between the first and second conductive bodies, the electrically conductive interconnect comprising ruthenium, wherein the ruthenium entirely fills the opening in the dielectric layer;
   wherein the ratio of the length of the electrically conductive interconnect to the minimum cross-sectional width of the electrically conductive interconnect is 20:1 or greater wherein a portion of the first conductive body extends laterally beyond the sides of the ruthenium body and wherein respective portions of the first conductive body do not laterally extend beyond the furthest lateral endpoints of the source/drain of the transistor.

2. The electronic structure of claim 1, further comprising an electrically conductive interconnect in the opening in the dielectric layer and providing electrically conductive connection between the first and second conductive bodies, the electrically conductive interconnect comprising said adhesion layer and said ruthenium body.

3. The electronic structure of claim 1 wherein the adhesion layer comprises titanium.

4. A method of fabricating an electronic structure comprising:
   providing a first conductive body, wherein the first conductive body is a silicide layer formed on and in contact with a source/drain of a transistor, a gate oxide and a gate, wherein the gate is a word line of a memory array;
   providing a dielectric layer over and in contact with the first conductive body, an upper surface of the dielectric layer forming a plane, wherein the dielectric layer comprises a silicon nitride layer;
   providing an opening through the dielectric layer;
   providing an adhesion layer in the opening through the dielectric layer to define a remaining opening;
   providing a ruthenium body entirely filling the remaining opening, wherein a ratio of a length of the ruthenium body to a minimum cross-sectional width of the ruthenium body is 20:1 or greater wherein a portion of the first conductive body extends laterally beyond the sides of the ruthenium body and wherein respective portions of the first conductive body do not laterally extend beyond the furthest lateral endpoints of the source/drain of the transistor and wherein the ruthenium body entirely fills the opening in the dielectric layer; and
   providing a second conductive body over and in contact with the dielectric layer, the second conductive body formed on the upper surface, wherein the second conductive body is a bit line of the memory array.

5. The method of claim 4, further comprising providing an electrically conductive interconnect in the opening in the dielectric layer and in contact with the first conductive body and the second conductive body and providing electrically conductive connection between the first and second conductive bodies, the electrically conductive interconnect comprising said adhesion layer and said ruthenium body.

6. The method of claim 4 wherein the adhesion layer comprises titanium.

* * * * *